(12) United States Patent
Bench et al.

(10) Patent No.: US 7,024,329 B2
(45) Date of Patent: Apr. 4, 2006

(54) METHOD AND APPARATUS FOR TESTING PCBA SUBCOMPONENTS

(75) Inventors: Samantha Bench, Whitefish, MT (US); John Dirkson, Santa Clara, CA (US); Alex Fishman, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/809,880

(22) Filed: Mar. 25, 2004

(65) Prior Publication Data

US 2005/0215081 A1    Sep. 29, 2005

(51) Int. Cl.
*G01R 31/02* (2006.01)

(52) U.S. Cl. .................... 702/117; 439/39; 324/758

(58) Field of Classification Search ............... 702/117; 209/571, 573; 324/539, 754, 755, 757, 758, 324/765; 710/64; 439/39
See application file for complete search history.

(56) References Cited

U.S. PATENT DOCUMENTS

| | | | | |
|---|---|---|---|---|
| 4,717,989 A | * | 1/1988 | De Barros et al. | 361/818 |
| 4,953,005 A | * | 8/1990 | Carlson et al. | 257/666 |
| 5,446,259 A | * | 8/1995 | Engstrom | 219/121.69 |
| 5,954,205 A | * | 9/1999 | Smith | 209/2 |
| 5,978,569 A | * | 11/1999 | Traeger | 709/244 |
| 6,064,195 A | * | 5/2000 | Clayton et al. | 324/158.1 |
| 6,108,162 A | * | 8/2000 | Amirkiai et al. | 360/97.01 |
| 6,437,586 B1 | * | 8/2002 | Robinson | 324/755 |
| 6,524,123 B1 | * | 2/2003 | Kedrowski et al. | 439/131 |
| 6,696,848 B1 | * | 2/2004 | Robinson | 324/755 |
| 6,718,099 B1 | * | 4/2004 | Chivers | 385/52 |
| 2002/0098728 A1 | * | 7/2002 | Kedrowski et al. | 439/131 |
| 2003/0092300 A1 | * | 5/2003 | Kedrowski et al. | 439/245 |
| 2004/0091231 A1 | * | 5/2004 | Hofmeister et al. | 385/147 |
| 2004/0092135 A1 | * | 5/2004 | Hofmeister et al. | 439/39 |
| 2005/0025449 A1 | * | 2/2005 | Dirkson et al. | 385/147 |

* cited by examiner

*Primary Examiner*—Carol S. W. Tsai
(74) *Attorney, Agent, or Firm*—Workman Nydegger

(57) ABSTRACT

An evaluator board for testing a printed circuit board assembly device subcomponent includes one or more receiving surfaces mounted on the evaluator board, and a securing mechanism positioned over at least one of the one or more receiving surfaces. The receiving surfaces can include a connection base and an electronic receptacle for receiving conductive elements of the subcomponent to be tested. In one implementation, at least one of the one or more receiving surfaces is configured to receive an edge connector of a form factor pluggable printed circuit board. In addition, one or more active and passive circuitry components can be mounted on opposing surfaces of the evaluator board in order to minimize the size and number of components used in the testing of the PCBA subcomponent.

23 Claims, 8 Drawing Sheets

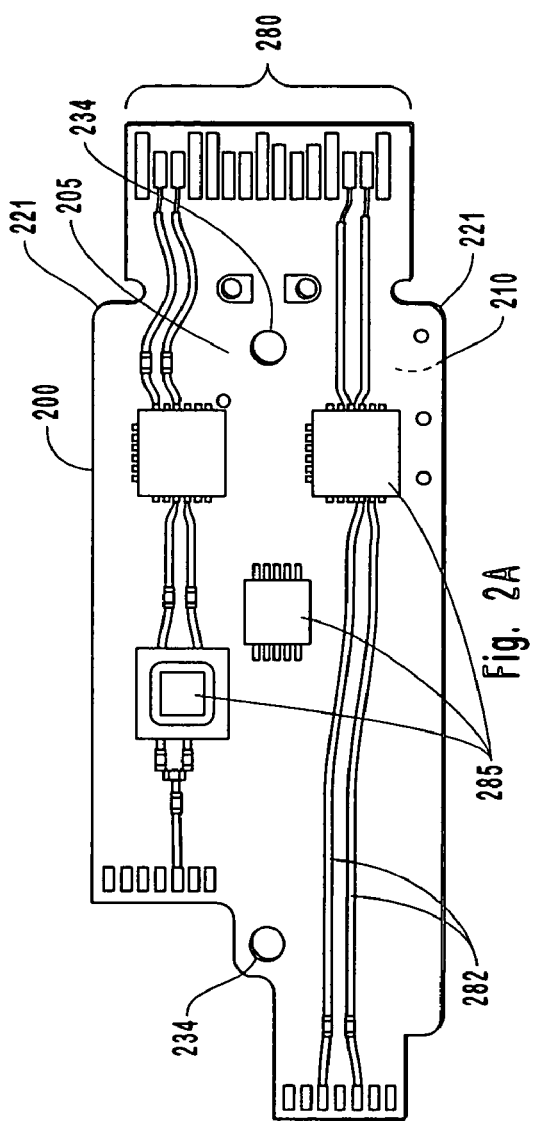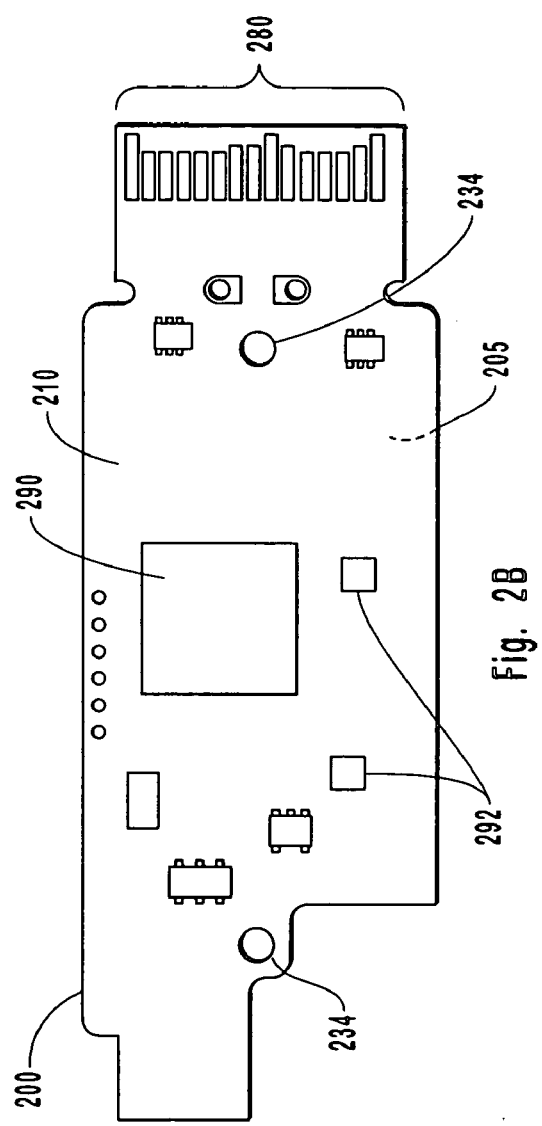
Fig. 2A
Fig. 2B

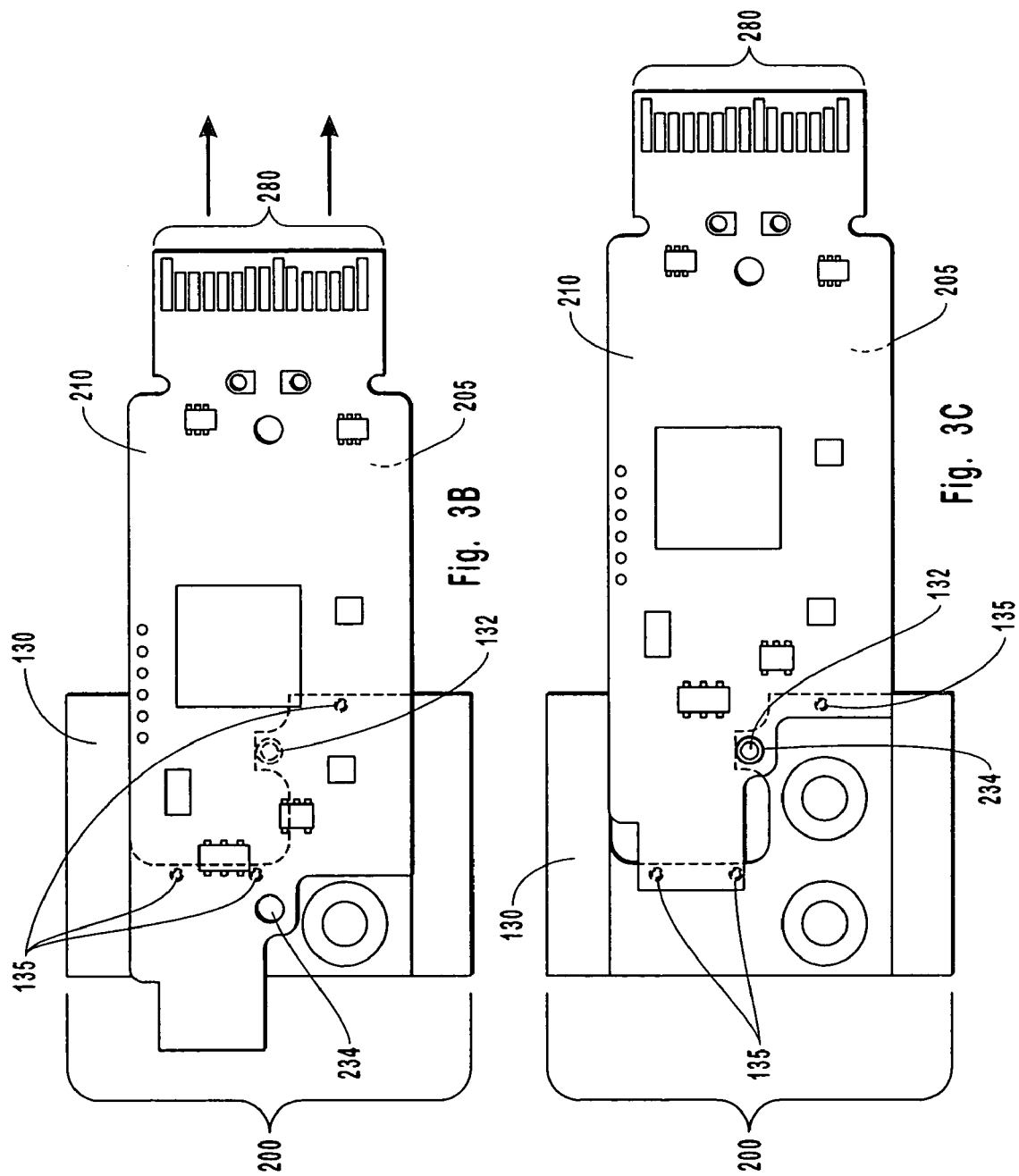

METHOD AND APPARATUS FOR TESTING PCBA SUBCOMPONENTS

BACKGROUND OF THE INVENTION

1. The Field of the Invention

The present invention relates to systems, methods, and apparatus for testing optical transmitter, receiver, and transceiver components. In particular, the present invention relates to testing printed circuit board assembly subcomponents.

2. Related Technology

Fiber optic technology is increasingly employed as a method by which information can be reliably transmitted via a communications network. Networks employing fiber optic technology are known as optical communications networks, and are marked by high bandwidth and reliable, high-speed data transmission.

Generally, multiple fiber optic components are designed to accomplish different aspects of these aims. For example, an optical transceiver has both optical sending and optical receiving capabilities, and can include one or more optical subassemblies ("OSA") such as a transmitter optical subassembly ("TOSA"), and a receiver optical subassembly ("ROSA"). Typically, each OSA is created as a separate physical entity that includes electrical circuitry for handling and converting the appropriate electrical and optical signals. Within the optical transceiver, each OSA generally includes electrical connections to various additional components such as a transceiver substrate, sometimes embodied in the form of a printed circuit board ("PCB").

The transceiver substrate can include multiple other active circuitry components particularly designed to drive or handle electrical signals sent to or returning from one or more of the electrically-attached OSAs. Accordingly, such a transceiver substrate will usually include a number of electrical transmission lines along with the one or more OSAs. These transmission lines are connected between the transceiver substrate and the OSA using different types of electrical connectors.

Assembling optical transceiver devices from optical components can include complicated and costly manufacturing processes. Due at least in part to the manufacturing complexity, assembled optical transceivers are often tested prior to use. For example, in order to ensure that an optical transceiver device is suited for an intended use, the manufacturer will often put the optical transceiver device through extensive testing procedures. The testing procedures are typically designed to ensure that optical transceiver devices are properly assembled, and to ensure that the optical transceiver device will perform properly within certain parameters. Optical transceiver tests often include a trained human tester using a testing apparatus, such as an "evaluator board", that is designed to simulate an operating environment.

Typically, "evaluator boards" are printed circuit boards that include a number of components such as one or more active circuitry components, one or more mounting positions for an optical device and, in some cases, one or more computerized system connection ports (e.g., a serial or parallel port, etc.). Evaluator boards, however, can be complex and therefore difficult to configure, particularly for testing small form factor ("SFF") printed circuit board assembly ("PCBA") subcomponents, including small form factor pluggable ("SFP"), and 10 gigabit small form factor ("XFP") PCBA subcomponents.

For example, general testing procedures and apparatus often require additional parts to fit on or around an assembled optical transceiver device, such as downward or sideward mounting clamps that would mount around an OSA. Testing apparatus may also require other circuitry (in additional to circuitry already present on an evaluator board) such as one or more electrical connection interfaces that are placed beside or mounted over the assembled optical transceiver device, in order to couple the evaluator board to connector pins extending from the optical transceiver device.

Due to the complexity associated with mechanically configuring these types of testing apparatus, trained personnel may be required to appropriately operate the testing apparatus. Thus, an entity that desires to use these types of testing apparatus must expend resources to hire skilled personnel or alternately train personnel in the appropriate skills.

Beside mechanical configuration complexities and difficulties, other disadvantages exist with present testing procedures and apparatus. One disadvantage is that an evaluator board may not diagnose the source of a test failure such as, for an assembled optical transceiver, with sufficient specificity. Thus, the specific components within, for example, the assembled optical transceiver, causing the test to fail may not be identified. Accordingly, the manufacturer may need to disassemble the device and further analyze each subcomponent in the failed device to identity the cause of the test failure.

However, the cost of disassembly and further analysis of components may be prohibitive as compared to assembling and testing a new PCBA subcomponent. Thus, the manufacturer may simply throw the failed device away. Non-specificity of test results can be further exacerbated when a manufacturer delegates the manufacturing of subcomponents, such as of the transceiver substrate, to a third party. For example, faulty testing information about the source of PCBA subcomponent failure may cause the manufacturer to easily waste time and money evaluating working subcomponents, and may create difficulties when trying to designate replacement costs to any third-party subcomponent manufacturers.

Accordingly, an advantage can be realized with systems and methods that allow a manufacturer to accurately diagnose errors in the components of small form factor PCBA subcomponent. In particular, an advantage can be realized with systems and methods that are easily implemented by a subcomponent manufacturer, and allow the subcomponent manufacturer to diagnose errors in subcomponents prior to assembly on the relevant PCBA.

BRIEF SUMMARY OF THE INVENTION

In general, embodiments of the present invention are directed to methods and apparatus for testing PCBA, such as a substrate of an optical transceiver, a module interface board (MIB), a test coupon board, and any other similar such board. More particularly, an evaluator module in accordance with aspects of the present invention allows a subcomponent manufacturer to more easily detect and diagnose errant printed circuit board assembly (PCBA) subcomponents prior to installing the subcomponents in the relevant PCBA device, such as, for example, an optical transceiver.

In one embodiment, an evaluator module for testing transceiver subcomponents includes an electrical connection receptacle mounted on an evaluator board, such as a printed circuit board. The evaluator module also includes a connection base mounted on the evaluator board, where the connection base has an upper, exposed surface and a lower surface mounted against the evaluator board. The upper, exposed surface is formed to allow the subcomponent to connect face downward, such that the upper surface of the subcomponent mounts directly against a connection base.

The evaluator board can include one or more electrical connection points that extend through the connection base from the evaluator board. The electrical connection points provide electrical contacts to the subcomponent that is to be tested. The electrical points also protrude through the evaluator board to circuitry on an underside, or lower surface, of the evaluator board, hence allowing use of circuitry on both an under surface and an upper surface of the evaluator board.

The evaluator board can also include one or more positioning components, such as one or more stoppers at a point adjacent to an electrical receptacle, and one or more guides adjacent to the connection base. The stoppers and guides can help guide the subcomponent to be positioned appropriately against the one or more electrical connection points. A retractable clamp positioned substantially over the exposed surface of the connection base helps to secure the subcomponent against the electrical connection points while a user tests the subcomponent.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 2A–2B illustrate different views of one implementation of a PCBA subcomponent that can be tested in accordance with aspects of the present invention;

FIGS. 3A–3C illustrate connecting a subcomponent to an evaluator board in accordance with aspects of the present invention;

DETAILED DESCRIPTION OF THE PREFERRED EMBODIMENTS

The present invention is directed to systems and apparatus for testing PCBA, such as a substrate of an optical transceiver, a module interface board (MIB), a test coupon board, and any other similar such board. More particularly, an evaluator module in accordance with aspects of the present invention allows a subcomponent manufacturer to more easily detect and diagnose errant printed circuit board assembly (PCBA) subcomponents prior to installing the subcomponents in the relevant PCBA device, such as, for example, an optical transceiver.

Figure 1A:
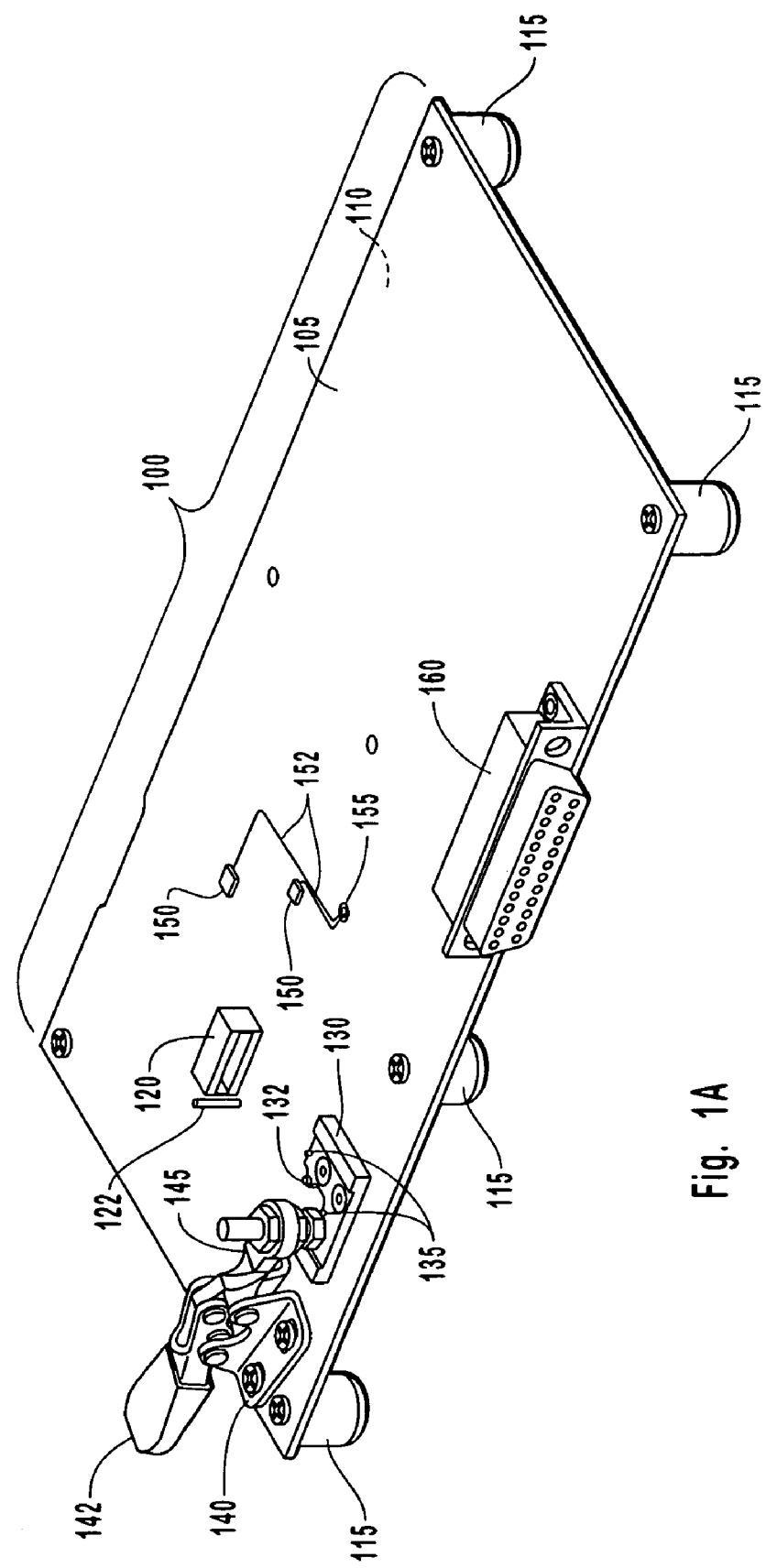
FIGS. 1A–1B illustrate different views of one implementation of an evaluator board in accordance with aspects of the present invention.

FIG. 1A illustrates a top view of an evaluator board 100 in accordance with aspects of the present invention. In general, evaluator board 100 can be a substantially planar device comprising materials and components that are suited for simulating a PCBA subcomponent environment. For example, the evaluator board 100 can comprise materials that relay electronic data between a computerized system that is connected to the evaluator board and circuitry mounted on the PCBA subcomponent to be tested. As such, one exemplary configuration of the evaluator board 100 is a silicon-based printed circuit board ("PCB") upon which are mounted one or more components for receiving the PCBA subcomponent to be tested, and upon which are mounted other components, as will be detailed herein. One will also appreciate the present invention can be used to test other such PCBA as a module interface board (MIB), a test coupon board, and so forth.

For example, to implement testing functions through the evaluator board 100, the evaluator board 100 can comprise one or more active and/or passive circuitry components 150, such as one or more memory modules, one or more microprocessors, one or more capacitors or resistors, and so forth. To pass data signals between components 150, the evaluator board 100 can also comprise one or more circuit lines 152 that provide communicable connections between each of the different components. In addition, to connect the evaluator board 100 to a computerized system (e.g., FIG. 5), the evaluator board 100 can include one or more computerized system connection interfaces 160, such as a serial, parallel, universal serial bus ("USB") ports and the like.

By way of explanation and not of limitation, the evaluator board 100 can be described in terms of having an "upper surface" 105 that is exposed directly to a tester, and an opposing "lower surface" 110 that is not exposed directly to the tester. One will appreciate, however, that the terms "upper" and "lower" are only arbitrary designations that provide convenience in describing aspects of the evaluator board 100. Thus, in some circumstances, either surface (e.g., 105 and 110) of the evaluator board 100 will be generally acceptable for use as an "upper" or "lower" surface.

Continuing with FIG. 1A, the figure shows that an evaluator board 100 can comprise an electronic receptacle 120 mounted on the upper surface 105 of the evaluator board 100. In exemplary implementations for testing a gigabit form factor ("XFP") subcomponent, the electronic receptacle 120 can receive edge connector pads. For example, referring briefly to FIGS. 2A and 2B electrical receptacle 102 can receive connector pads 280. Of course, the electronic receptacle 120 can also be configured to receive any subcomponent to be tested, such as a receptacle for a single or dual pin header, as well as a lead frame (not shown), or any other type of connectors that can be used in other form factor components, and so forth.

The evaluator board 100 also includes a subcomponent mounting assembly that comprises connection base 130. Connection base 130 comprises a mounting surface for receiving the subcomponent to be tested. A clamp assembly 140 for securing the subcomponent against the connection base 130 is shown extending over the connection base 130. The clamp assembly 140 can be any type of securing means suitable for securing the subcomponent against the connection base 130. As illustrated in FIG. 1A, however, the securing means includes a clamp assembly 140 having a depressible arm 142 and a retractable clamp head 145, which can be depressed upon the connection base 130.

One or more electrical connection points 135 and an optional guide post 132 are also depicted in FIG. 1A. The electrical connection points 135 can be placed so as to contact various conductive positions on the subcomponent to be tested, as appropriate. The guide post 132 can provide a convenient mechanical fixture for ensuring that the electrical connection points 135 are positioned correctly against the subcomponent to be tested. Similar to the function provided by guide post 132, the evaluator board 100 can also include one or more stoppers 122 that extend from the upper surface 105 of the evaluator board 100. The one or more stoppers 122 can be configured to help guide an electrical connector (e.g., an edge connector) on the given subcomponent to be tested into the electronic receptacle 120. In at least one implementation, the one or more stoppers 122 prevent the subcomponent to be tested from being inserted too far into the electronic receptacle 120.

Figure 1B:
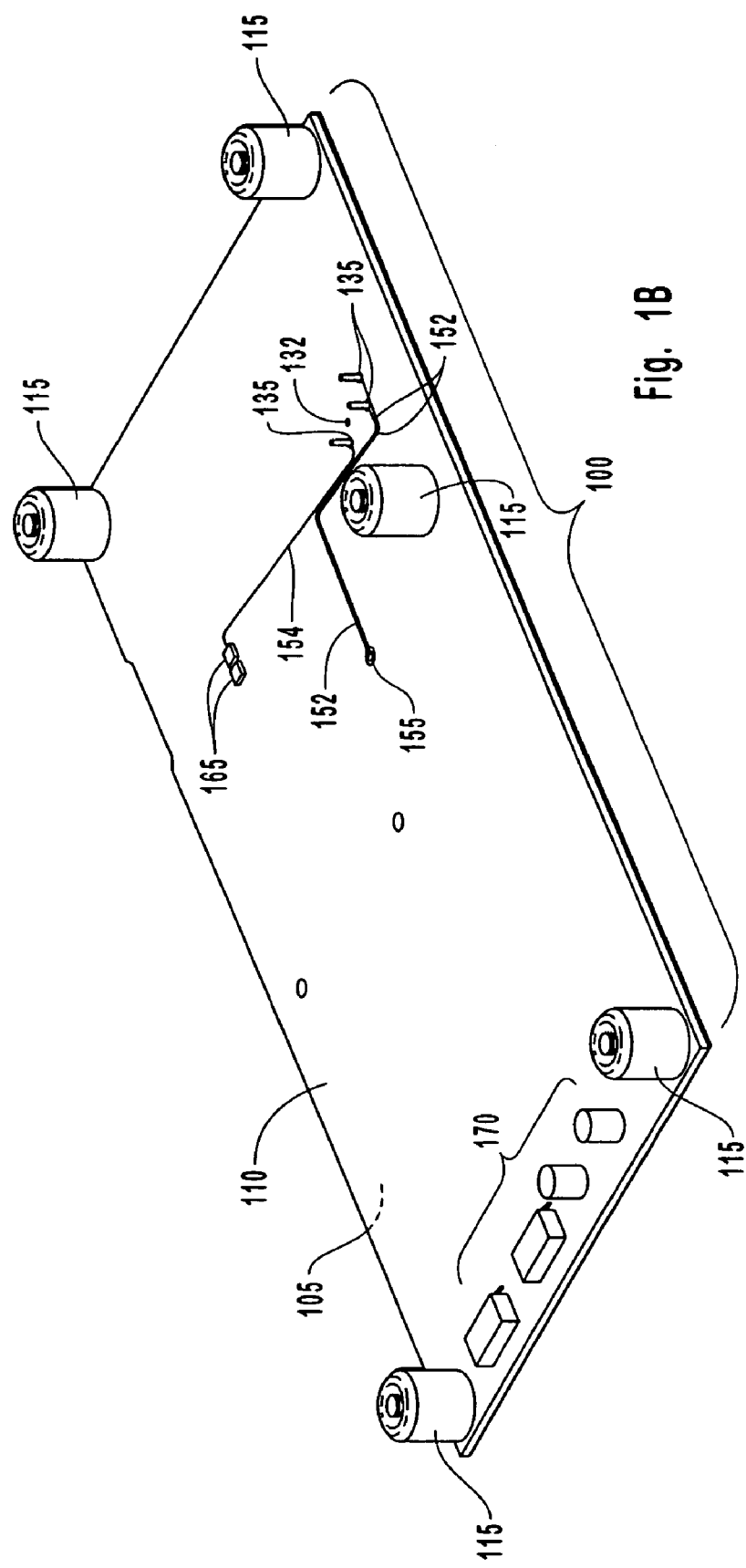

FIG. 1B shows a bottom view of the evaluator board 100, primarily from the perspective of the lower surface 110. As shown, multiple different legs 115 can be mounted to the underside of the lower surface 110. Legs 115 can, in some embodiments, be geared primarily so that components 170 that are mounted beneath the evaluator board 100 will not be touched by another surface (not shown). In other embodiments, legs 115 can be configured to fit into appropriate receiving surfaces on another surface (not shown) so that the evaluator board 100 will not slide during testing.

Like the upper surface 105, lower surface 110 can also include other active and passive circuitry components 165 and 170 such as micro controllers, capacitors, a resistors, and so forth. As such, perforations 155 between the lower surface 110 and upper surface 105 allow electrical circuitry 152 to communicably connect components 150 on the upper surface 105 of the evaluator board 100 with the lower surface 110 components 165 and 170. Perforations 155, therefore, help facilitate data communications between any given circuitry components mounted on any side of the evaluator board 100. Similarly, electrical connection points 135 can be configured to extend between both the upper surface 105 and the lower surface 110 of the evaluator board 100. This can also provide a direct communication link from a given subcomponent to be tested to any given active or passive circuitry component on the evaluator board 100 without the aid of additional circuitry. Implementing both surfaces of the evaluator board in this manner can provide an efficient use of available evaluator board space.

FIGS. 2A and 2B illustrate two different views of a PCBA subcomponent to be tested, such as a transceiver substrate 200. In at least one implementation of the present invention, the subcomponent 200 is any type of conventional substrate that can be used in PCBA devices such as small form factor and gigabit form factor PCBAs. As shown in FIG. 2A, for example, the subcomponent 200 is a printed circuit board having etched electrical circuit traces 282 on a subcomponent surface 205, and including an end configured as an edge connector 280. The etched circuit traces 282 provide communicable electrical connections between active and/or passive circuitry components 285, such as an avalanche photo diode, a laser bias control, a laser driver, one or more capacitors and resistors, and so forth.

The subcomponent 200 can also be manufactured such that one or more notches 221 are configured to abut one or more stoppers 122 when the subcomponent 200 is placed on the evaluator board 100. This abutment between notches 221 and stoppers 122 can prevent the subcomponent 200 from sliding too far into electronic receptacle 120, and therefore ensure an appropriate electrical connection. In addition, as will be discussed in greater detail in FIGS. 3B–3C, the subcomponent 200 can also include one or more receiving portions 234 in the subcomponent 200 that can help guide the subcomponent 200 into an appropriate position on the connection base 130. In at least one embodiment, receiving portions 234 can be perforations that are configured to receive a guide post.

As shown in FIG. 2B, the subcomponent can further include different active and/or passive circuitry components 292 mounted on an opposing surface 210, such as a microcontroller 290, and one or more resistors, capacitors, etc. One will appreciate, however, that the number and type of components that are placed on a given subcomponent surface 205 and 210 can be based on a manufacturer's preference, and is therefore not limiting. Furthermore, for descriptive purposes in this disclosure and claims, surface 205 will be understood to be a "lower" surface of a transceiver subcomponent 200, and surface 210 will be understood to be an "upper" surface of a transceiver subcomponent 200. One will also appreciate that the designations of "upper" and "lower" are arbitrary designations that can vary from one subcomponent to another.

Figure 3A:
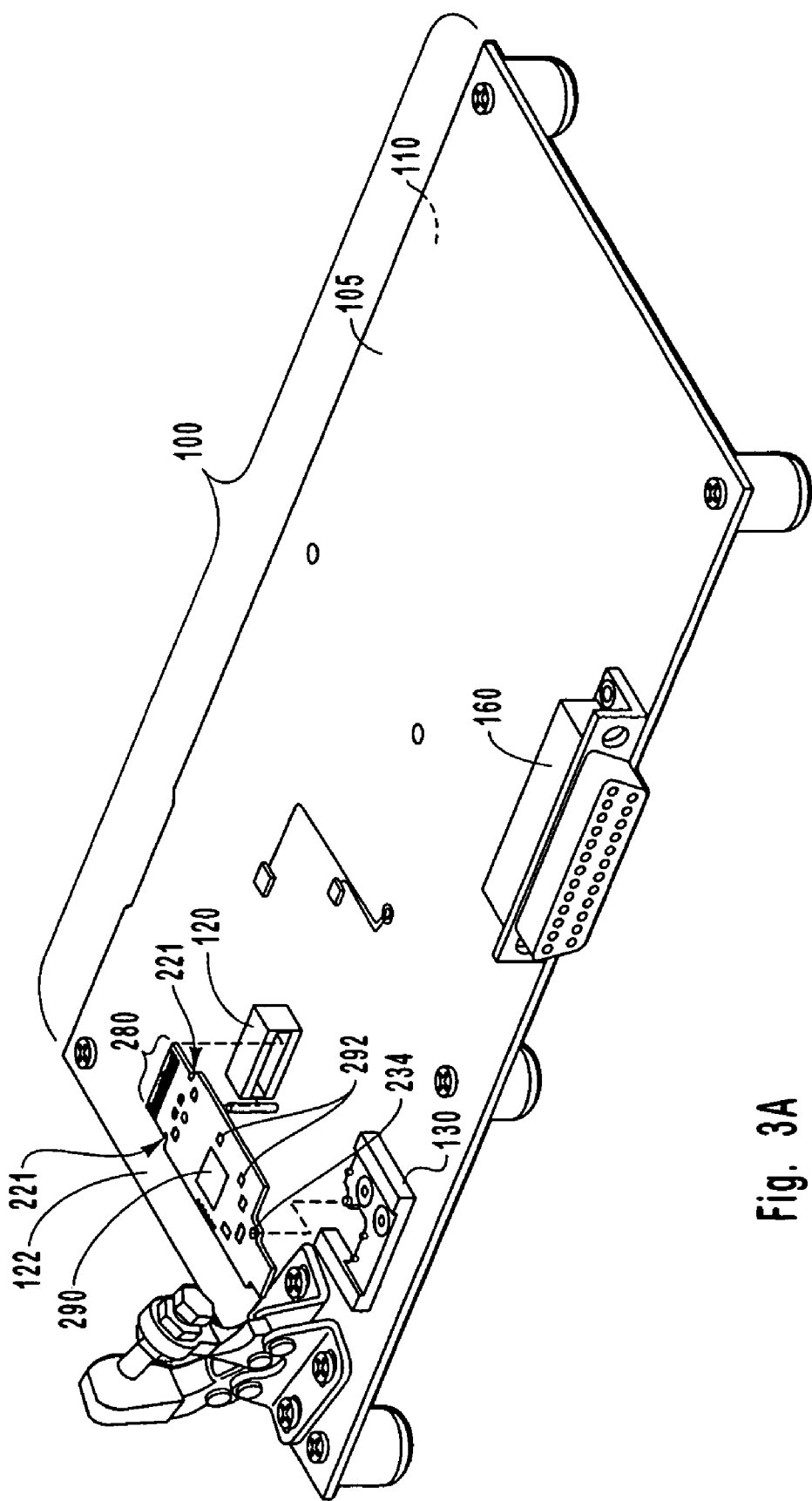

FIGS. 3A through 3C illustrate connecting sub-component 200 to the evaluator board 100, in accordance with at least one aspect of the present invention. As shown in FIG. 3A, for example, an edge connector portion 280 can be positioned so that the edge connector portion 280 slidably fits into an electronic receptacle 120. As previously described herein, stoppers 122 help guide the subcomponent 200 into position by preventing the subcomponent 200—at subcomponent notches 221—from going too far into the electronic receptacle 120.

The stoppers 122 can also help guide the subcomponent 200 onto other electrical connections at the opposing end of the subcomponent 200, such that when the subcomponent abuts one or more stoppers 122, the subcomponent 200 is positioned appropriately over connection base 130. As depicted, the subcomponent 200 can be inverted so that the upper surface 205 rests directly on the connection base 130. As such, the lower surface 210 of the subcomponent is exposed to the user.

In particular, FIG. 3B illustrates subcomponent 200 above connection base 130 before subcomponent 200 has been inserted into electronic receptacle 120. The arrows indicate the direction of receptacle 120 relative to connection base 130. Since, in this configuration, upper surface 205 aces toward the evaluator board 100, guidepost 132 is configured to insert into the corresponding receiving portion 234 in the subcomponent 200. Hence, the guidepost 132 can help secure the subcomponent 200 against the connection base 130 when the subcomponent 200 is in the appropriate position (FIG. 3C). Thus, slidably positioning subcomponent 200 into a substantially fitted position against the connection base 130 can result in the subcomponent mounting to evaluator board 100.

FIG. 3C illustrates subcomponent 200 as secured in receptacle 120. As shown in FIG. 3C, therefore, when the subcomponent is aligned appropriately, guidepost 132 fits within receiving portion 234, and connection points 135 align against conductive elements (e.g., circuit traces 282) on the subcomponent 200. In this orientation, an electrical connection can be made between connection points 135 and the subcomponent edge connector pads 280, which are mounted inside the electronic receptacle 120.

Figure 4A:
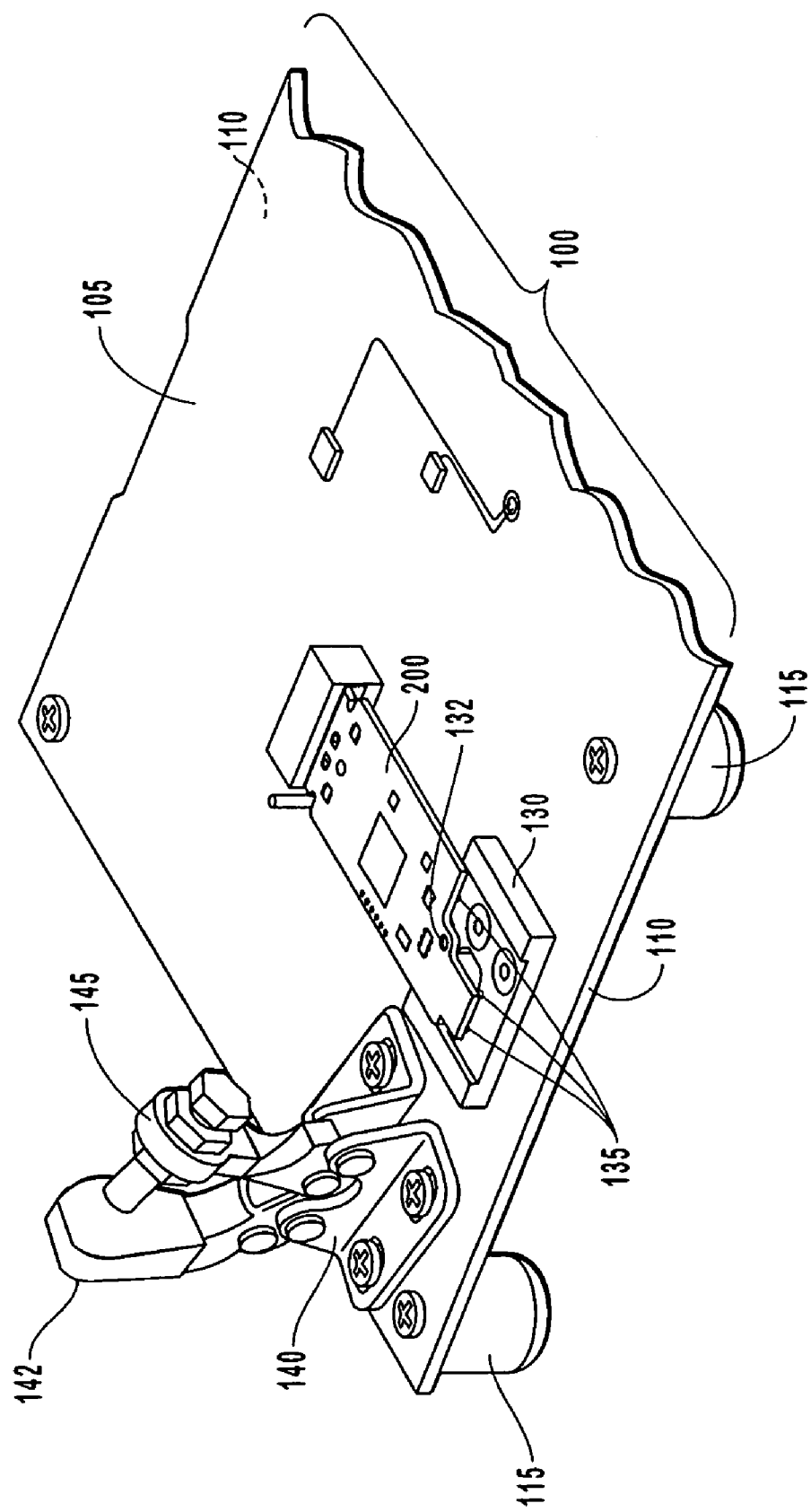
FIGS. 4A–4B illustrate securing a connected subcomponent to an evaluator board in accordance with aspects of the present invention.
Figure 4B:
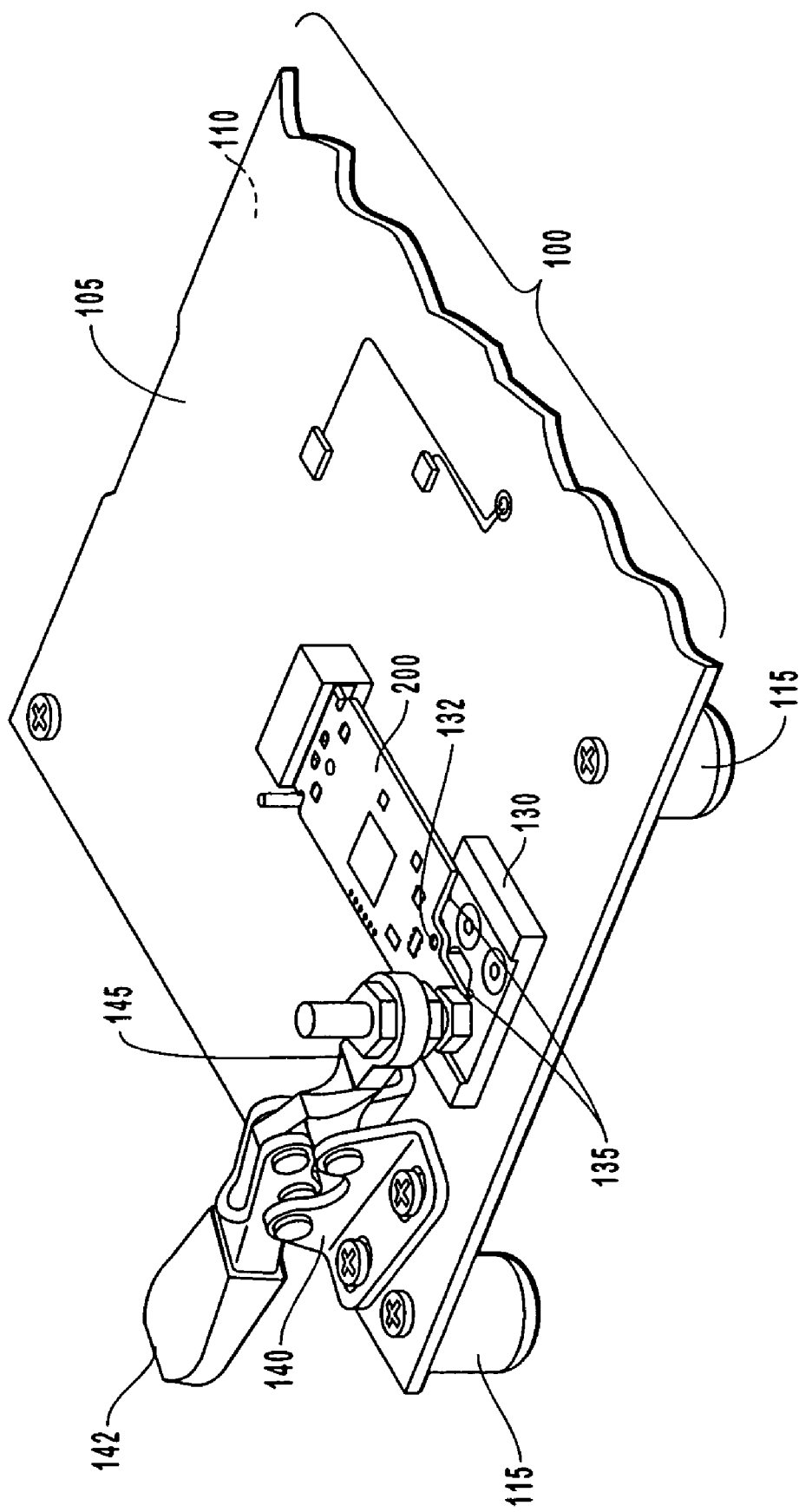

FIGS. 4A and 4B illustrate securing a connected subcomponent 200 to the evaluator board 100 using an exemplary clamping assembly 140. In FIG. 4A, for example, a subcomponent 200 is mounted into position onto the connection base 130. A tester (e.g., a human tester) can then depress a handle 142, which pulls the handle 142 away from the clamping head 145. As shown in FIG. 4B, when the handle 142 is fully depressed, the clamping head 145 presses directly against the subcomponent 200, which in turn allows for secure electrical contacts between the subcomponent 200 and the electrical connection points 135.

Figure 5:
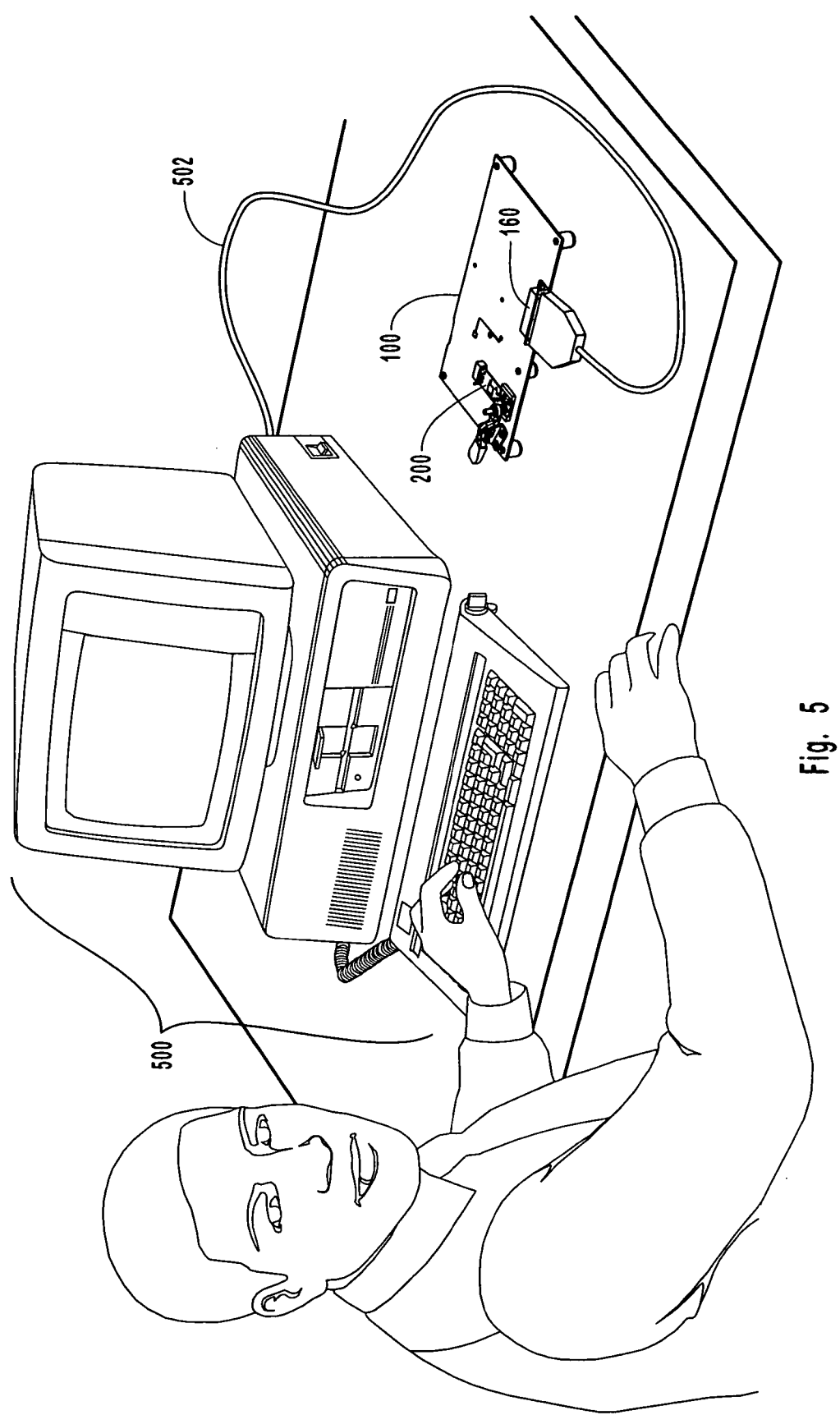
FIG. 5 illustrates an environment for testing PCBA subcomponents in accordance with aspects of the present invention.

FIG. 5 illustrates an environment for testing PCBA subcomponents. The environment of FIG. 5 includes a computer system 500. Cable 502 can be connected from an appropriate interface port at computer system 500 to port 160. Accordingly, board 100. A human tester can then log into the computer system 500 and send commands to evaluator board 100. Computer system 500 can include a user interface configured to receive user commands and, in response, simulate various different environments for the transceiver component substrate 200. Thus, human test can test the component substrate under various (and potentially adverse) conditions before the component substrate 200 is assembled into a PCBA device. Embodiments of the present invention, therefore, provide cost effective and efficient solutions for testing PCBA subcomponents before assembling the given subcomponents into a corresponding PCBA device.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An evaluator board comprising:
an electrical connection receptacle mounted on the evaluator board;
a connection base mounted on the evaluator board, the connection base being configured to receive an upper surface of a subcomponent, wherein the connection base is positioned opposite the electrical connection receptacle such that the subcomponent is connected to the connection base and electrical connection at two opposing ends when the subcomponent is received;
one or more electrical points extending from the exposed surface of the connection base, the one or more electrical points providing a communicable electrical connection between the upper surface of the subcomponent and one or more circuit traces on the evaluator board; and
a securing mechanism positioned substantially over the connection base.

2. The evaluator board as recited in claim 1, wherein the subcomponent is at least one of a printed circuit board for use in an optical transceiver, a module interface board, and a test coupon board.

3. The evaluator board as recited in claim 1, wherein the securing mechanism secures the subcomponent against the connection base.

4. The evaluator board as recited in claim 1, wherein the electrical connection receptacle is configured to receive an edge connector portion of the subcomponent.

5. The evaluator board as recited in claim 1, wherein the evaluator board comprises circuitry components on both an upper and lower surface of the evaluator board, wherein the circuitry are communicably connected for testing the subcomponent.

6. The evaluator board as recited in claim 1, further comprising one or more stoppers extending from the evaluator board, the one or more stoppers positioned such that the subcomponent is received into the electrical connection receptacle while maintaining electrical conductivity.

7. The evaluator board as recited in claim 1, further comprising one or more guideposts extending from the connection base, the one or more guideposts configured to secure the subcomponent in an appropriate alignment with respect to the connection base.

8. The evaluator board as recited in claim 1, wherein the securing mechanism comprises a clamp having a depressible arm and a retractable clamp head.

9. The evaluator board as recited in claim 1, further comprising one or more connection ports for connecting the evaluator board to a computerized system.

10. The evaluator board as recited in claim 9, wherein the one or more connection ports include at least one of a serial port, a parallel port, a small computer system interface port, a USB port, an Ethernet port, and an optical connection port.

11. An evaluator board for testing one or more subcomponents of a printed circuit board assembly comprising:
a printed circuit board;
one or more circuitry components for performing one of driving and testing a subcomponent to be tested, the one or more circuitry components mounted on both and upper surface and a lower surface of the printed circuit board;
one or more receiving components configured to receive the subcomponent to be tested, at least one of the receiving components communicably connected to at least one of the one or more circuitry components; and
one or more connection points extending from a particular one of the one or more receiving components, the one or more connection points providing a communicable link between the subcomponent to be tested and an evaluator component included in the one or more circuitry components.

12. The evaluator board us recited in claim 11, wherein at least one of the one or more receiving components is configured to receive an edge connector of the subcomponent to be tested.

13. The evaluator board as recited in claim 11, wherein the printed circuit board comprises one or more perforations that allow one or more circuit lines to transfer data between evaluator components on the upper surface and the lower surface of the printed circuit board.

14. The evaluator board as recited in claim 11, further comprising one or more stoppers extending from the printed circuit board, the one or more stoppers configured to position the subcomponent adjacent one or more of the one or more receiving components.

15. The evaluator board as recited in claim 11, further comprising one or more guideposts extending from at least one of the one or more receiving components, the one or more guideposts configured to fit within one or more corresponding perforations in the subcomponent.

16. The evaluator board as recited in claim 11, wherein the one or more receiving components comprises a connection base that is placed on the printed circuit board such that the one or more receiving components electrically connected with the subcomponent two opposing ends of the subcomponent when the subcomponent is received into to one or more receiving components.

17. The evaluator board as recited in claim 11, further comprising a retractable securing mechanism positioned over at least one of the one or more receiving components.

18. The evaluator board as recited in claim 11, further comprising one or more connection ports for connecting the evaluator board to a computerized system.

19. The evaluator board as recited in claim 18, wherein the one or more connection ports include at least one of a serial port, a parallel port, a small computer system interface port, a USB port, an Ethernet port, and an optical connection port.

20. A method of testing a subcomponent of a printed circuit board assembly comprising:
placing a subcomponent to be tested on a evaluator board such that an upper surface of the subcomponent fits against at least one of a connection base and an edge connection receptacle which are mounted on the evaluator board;
positioning the subcomponent on the evaluator board so that a front end of the subcomponent electrically connects with one or more connection points extending out from the connection base and so that a back end of the subcomponent electrically connects to the edge connection receptacle, wherein the front end and the back end are electrically connected to one or more components mounted on a lower surface and an upper surface of the evaluator board;
clamping the subcomponent against the evaluator board, wherein a clamp secures the front end of the subcomponent to be tested against the connection base.

21. The method as recited in claim 20, wherein positioning the subcomponent to be tested comprises aligning one of the front end and the back end of the subcomponent to be tested into the edge connection receptacle.

22. The method as recited in claim 20, wherein positioning the subcomponent to be tested comprises sliding a receiving portion of the subcomponent against one or more stoppers extending from the evaluator board.

23. The method as recited in claim 20, wherein positioning the subcomponent to be tested comprises sliding a receiving portion of the subcomponent to be tested onto a guidepost that extends from the evaluator board.

* * * * *

UNITED STATES PATENT AND TRADEMARK OFFICE
CERTIFICATE OF CORRECTION

PATENT NO.        : 7,024,329 B2                                Page 1 of 1
APPLICATION NO. : 10/809880
DATED             : April 4, 2006
INVENTOR(S)       : Bench et al.

It is certified that error appears in the above-identified patent and that said Letters Patent is hereby corrected as shown below:

Column 4
Line 5, before "PCBA", insert --a--
Line 64, change "102" to --120--

Column 5
Line 44, before "resistors", remove "a"

Column 6
Line 54, change "upper" to --lower--
Line 55, change "lower" to --upper--
Line 61, change "upper" to --lower--

Column 7
Line 28, after "Accordingly,", insert --cable 502 can facilitate communication between computer system 500 and evaluator--

Column 9
Line 14, after "into", change "to" to --the--

Column 10
Line 19, before "edge", change "the" to --an--

Signed and Sealed this

Twenty-sixth Day of August, 2008

JON W. DUDAS
*Director of the United States Patent and Trademark Office*